United States Patent [19]

Hoessel et al.

[11] Patent Number: 5,518,865

[45] Date of Patent: May 21, 1996

[54] PRODUCTION OF MICROSTRUCTURE ELEMENTS

[75] Inventors: Peter Hoessel, Schifferstadt; Gerhard Hoffmann, Otterstadt; Juergen Langen, Bonn; Holger Reinecke, Ruelzheim, all of Germany

[73] Assignee: BASF Aktiengesellschaft, Ludwigshafen, Germany

[21] Appl. No.: 400,011

[22] Filed: Mar. 6, 1995

Related U.S. Application Data

[63] Continuation of Ser. No. 991,393, Dec. 16, 1992, abandoned.

[30] Foreign Application Priority Data

Dec. 14, 1991 [DE] Germany .......................... 41 41 352.0

[51] Int. Cl.[6] .............................. G03C 5/00; G03C 1/492; G03C 1/494; G03C 1/76
[52] U.S. Cl. ...................... 430/326; 430/270.1; 430/908; 430/966; 430/967
[58] Field of Search ................................... 430/270, 296, 430/285, 326, 908, 942, 967, 966

[56] References Cited

U.S. PATENT DOCUMENTS

| | | | |
|---|---|---|---|
| 4,393,129 | 7/1983 | Glashauser et al. | 430/296 |
| 4,551,414 | 11/1985 | Asmussen et al. | 430/326 |
| 4,744,365 | 5/1988 | Kaplan et al. | 128/335.5 |
| 4,990,222 | 2/1991 | Aigner et al. | 203/91 |
| 5,298,367 | 3/1994 | Hoessel et al. | 430/326 |

FOREIGN PATENT DOCUMENTS

| | | | |
|---|---|---|---|
| 314245 | 5/1989 | European Pat. Off. . | |
| 63-236321 | 10/1988 | Japan | 430/967 |

OTHER PUBLICATIONS

G. Rafler, L. Dahlmann, I. Ruhnau, Acta Polymerica 41 (1990) 628.

Ph. Dubois, et al. Macromolecules 24 (1991) 2266.

Rafler et al., Acta Polymerica 41 (1990) 611.

*Primary Examiner*—George F. Lesmes
*Assistant Examiner*—Bernard P. Codd
*Attorney, Agent, or Firm*—Keil & Weinkauf

[57] ABSTRACT

The invention relates to a process for producing microstructure elements having structure depths of from several μm to the mm region by imagewise irradiation of polymers with X-rays, where the polymers employed are aliphatic polyesters.

8 Claims, No Drawings

PRODUCTION OF MICROSTRUCTURE ELEMENTS

This application is a continuation of application Ser. No. 07/991,393, filed on Dec. 16, 1992, now abandoned.

The present invention relates to a process for producing microstructure elements having structure depths of from several μm to the mm region with lateral dimensions in the micron region by irradiating polymers with X-rays, followed by development with suitable developer media.

The development of microelectronics has shown that the consequent miniaturization and integration has resulted in a confusing variety of new products with corresponding technologies. In a few years, microelectronics has achieved a considerable lead in miniaturization over other branches of industry. In the meantime, it is emerging that other microtechnologies will in the future also achieve considerable importance; mention should be made, in particular, of micromechanics and integrated optics. In combination with microelectronics, technologies of this type open up an unimaginable number of new electronic, optical, biological and mechanical functional elements.

In the mass production of nonelectronic assemblies, system components and subsystems of microtechnology, the extremely high-performance production methods of semiconductor technology are naturally utilized to a very considerable extent. At the same time, it must be attempted to update classical methods of precision engineering for micromechanics and to fuse them with appropriately modified semiconductor production methods in order to be able to leave the narrow confinements of silicon planar technology and to develop new design possibilities based on a wide range of shapes and materials. This requirement is satisfied to a considerable extent by the LIGA process, which is based on the production steps lithography, electroforming and casting and was developed at the Kernforschungszentrum Karlsruhe (KfK).

Interesting microstructure products are sensors for measuring acceleration, flow rate, ultrasound, humidity and the like, micromotors, micropneumatic components, microconnectors for microelectronics, microoptical components, fiber optics, microelectrodes, spinnerets, microfilters, sliding bearings, membranes and many others.

The essential production step of the LIGA process is the structure-accurate irradiation of the polymer employed. The feasibility of the LIGA process has been demonstrated by means of simple microstructures using a specially prepared polymethyl methacrylate (referred to below as PMMA).

In the production of complex three-dimensional structure having structure depths of from several μm to the mm region by the abovementioned LIGA process, it has been found that PMMA requires a large amount of irradiation.

It has furthermore been shown that, during development of the irradiated polymer areas using a suitable developer medium, the non-irradiated areas swell, thereby destroying fine microstructures. On the other hand, swollen polymer areas result in stress cracking on drying, which results in unusable microstructure elements on electroforming. The cause of these problems is the high solvent sensitivity of PMMA.

It is an object of the present invention to find a polymer which requires less synchrotron radiation, depolymerizes on exposure to X-ray light and can be selectively removed using specific developers; the polymer should furthermore facilitate simple sample production, for example by injection molding, compression molding, extrusion or casting, and should not exhibit any swelling, stress cracking or defects.

It should also be possible to microstructure the polymer, ie. the polymer, even as a microstructure measuring from 5 to 10 μm, at the same time as a high aspect ratio (=structure depth:structure width) of from 5:1 to 1000:1, preferably from 20:1 to 50:1, should have adequate thermomechanical strength. In order that electroforming processes are survived without difficulty, the polymer should be mechanically stable up to 60° C. and should simultaneously be resistant to, for example, sulfuric acid and amidosulfuric acid.

We have found that, surprisingly, these objects are achieved by aliphatic polyesters, in particular polyglycolide and polylactide homopolymers and copolymers, and homopolymers and copolymers of 3- and 4-hydroxybutyric acid.

The suitability of polyglycolide and polylactide homopolymers and copolymers for producing microstructure elements in which a high aspect ratio is important, as is necessary, for example, for the LIGA process, and the advantages arising were surprising and were not obvious from the publications published hitherto.

The present invention accordingly provides a process for producing microstructure elements having structure depths of from several μm to the mm region by imagewise irradiation of polymers with X-rays, wherein the polymers employed are aliphatic polyesters.

Preferred aliphatic polyesters for this purpose are polyglycolide, polylactide or glycolide/lactide copolymers.

The X-rays employed are preferably in the form of synchrotron radiation.

In order to carry out the process according to the invention, the aliphatic polyesters can be applied to a substrate by injection molding, extrusion and/or compression molding.

The process according to the invention allows microstructure elements having structure depths of from 3 μm to 2000 μm to be produced, so that the polymer can be structured to a depth of from 10 μm to 2000 μm with lateral dimensions of less than 10 μm by irradiation with synchrotron radiation and treatment with selective developers.

Examples of suitable selective developers are preferably aqueous or alcoholic sodium hydroxide solutions or amine-containing developer solutions.

In the process according to the invention, the irradiation is carried out using high-energy, parallel radiation from an X-ray source. The wavelength of this irradiation is in the range from 0.1 to 10 nm, preferably from 0.1 to 1 nm.

Irradiation of this type can be produced, for example, on a synchrotron using special preabsorbers, for example comprising beryllium and/or polyimide film (for example Kapton® from Du Pont de Nemours) for from 1 to 300 minutes at a mean ring current of 25 mA.

The irradiation output depends on the electron energy in the electron storage ring which branches off from the synchrotron. In general, the electron energy is from 1.6 to 2.3 GeV.

The imagewise irradiation is usually carried out using special X-ray masks, for example a titanium base foil with gold absorber structures.

The polymers employed according to the invention are aliphatic polyesters, in particular polyglycolide and polylactide homopolymers and copolymers.

Polyglycolide and polylactide homopolymers and copolymers are known and are described, for example, in U.S. Pat. No. 4,744,365, EP-A 314 245, JP 122,643 (=J6 0014-861-

A), EP-A 264 926, G. Rafler, L. Dahlmann, I. Ruhnau, Acta Polymerica 41 (1990) 628, Ph. Dubois, C. Jacobs, R. J érôme, Ph. Teyssié, Macromolecules 24 (1991) 2266, R. Rafler, J. Dahlmann, Acta Polymerica 41 (1990) 611, and T. Masuda, A. Matsuda, S. Yamazaki, I. Takahashi, K. Sato, Polymer Preprints, Japan 39 (1990) 5.

Particularly suitable for the process according to the invention are polyglycolides, D,L-polylactide, D- and L-polylactide and copolymers, ie. glycolide-D,L-lactide, glycolide-D-lactide, glycolide-L-lactide, L-lactide-D,L-lactide and D-lactide-D,L-lactide copolymers.

In addition, copolymers containing up to 50% of ε-caprolactone and/or trimethylene carbonate are suitable as starting component, for example L-lactide-ε-caprolactone, L-lactide-trimethylene carbonate, glycolide-ε-caprolactone and glycolide-trimethylene carbonate copolymers. Also suitable are homopolymers and copolymers of 3- and 4-hydroxybutyric acid, for example copolymers of 3- and 4-hydroxybutyric acid with hydroxyvaleric acids (ratio between the comonomers of from 100:5 to 100:50, preferably from 9:1 to 7:3), for example Biopol® polymers from ICI.

In general, the aliphatic polyesters used have a mean molecular weight of from 10,000 to 1,000,000, preferably from 200,000 to 300,000, and inherent viscosities of from 2.5 to 9, dl/g, preferably from 7 to 9 dl/g.

The process according to the invention is preferably carried out using partially crystalline derivatives having melting points of from 140° to 230° C. e.g. polyglycolide, L- or D-polylactide and copolymers such as glycolide-L,D-lactide and L-lactide-D,L-lactide copolymers.

Examples of particularly preferred aliphatic polyesters of this type are poly-L-lactide (e.g. Resomer® L 214 from Boehringer, Ingelheim) and L-lactide(90)-D,L-lactide( 10) copolymer (e.g. Resomer LR 909).

Suitable aliphatic polyesters can preferably be prepared by ring-opening polymerization of

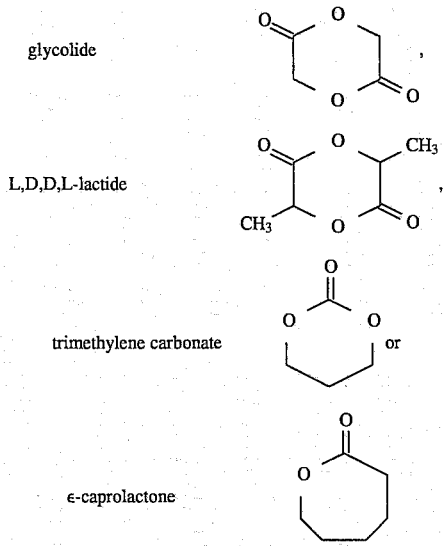

glycolide

L,D,D,L-lactide trimethylene carbonate

ε-caprolactone (cf. R. Rafler, J. Dahlmann, Acta Polymerica 41 (1990) 611).

However, polyglycolide can also be prepared from carbon monoxide and formaldehyde (cf. T. Masuda, Polymer Preprints, Japan 39 (1990)5).

In order to produce microstructure elements, as stated above, the aliphatic polyesters, in particular polyglycolide and polylactide homopolymers and copolymers, as granules or in powder form, can be applied to and fixed on an electroconductive metal substrate, for example comprising nickel, copper or steel, to which a 0.1 to 50 μm layer of a further metal or metal oxide, e.g. titanium, may have been applied, by conventional processes, for example by compression molding, injection molding and/or extrusion, at from 20° to 240° C., if necessary with the additional use of special adhesive coatings or adhesion promoters. The thickness of the homopolymer or copolymer layer on the metal substrate is generally from 20 to 2000 μm, preferably from 50 to μm, in particular from 100 to 500 μm. The surface of the homopolymer or copolymer layers should expediently be very smooth.

After imagewise irradiation, development is carried out using suitable developer media.

Developers which can be employed are basic developers, e.g. from 0.1 to 20% strength sodium hydroxide solutions in water or in water/isopropanol mixtures. The non-irradiated areas are not attacked.

It is also possible to structure the polymers using organic acids (formic acid or acetic acid) or aminic developers, but the structure depths are below those achieved using sodium hydroxide solution.

The microstructures obtained in this way have considerably greater structure depths compared with GG developers (developer mixtures as disclosed by Glashauser in U.S. Pat. No. 4,393,129), as described in DE-C-30 39 110 for PMMA, for the same amount of irradiation. This developer comprises a mixture of a material selected from the glycol ether group, for example, ethylene glycol monobutyl ether or diethylene glycol monobutyl ether, a material selected from the primary amine group, for example, monoethanol amine, an aqueous material, for example water, and a material selected from the azine group, for example, tetrahydro-1,4-oxazine. It is thus possible to produce structures having lateral dimensions of less than 10 μm with a maximum structure depth of several hundred μm and no defects.

The microstructures obtained in this way have sharp, steep edges and smooth walls and are resistant to the electroplating baths, e.g. acidic copper or nickel baths, used in the LIGA process. The microstructures remain unchanged after 24 hours in an electroplating bath at from 20° to 60° C.

The greatest advantage of the aliphatic polyesters employed according to the invention compared with PMMA as resists for the LIGA process, apart from the structure depths, is their excellent resistance to stress cracking in the microstructures.

In the examples below, parts and percentages are by weight, unless stated otherwise.

EXAMPLE 1

An L-polylactide having an inherent viscosity of from 7 to 9 dl/g (for example the commercial product Resomer® L 214 from Boehringer KG) as a test specimen measuring 30×10×2 mm was irradiated imagewise for 13.5 minutes on a synchrotron with an electron energy of 2.3 GeV at a mean ring current of 25 mA and a scanner traverse of 10 mm through an X-ray mask containing test structures. The structuring took place during subsequent development with a 1% strength solution of sodium hydroxide in water/isopropanol 1:1 at 25° C. for 30 minutes. The structure depth was 350 μm. The structured L-polylactide is completely free from stress cracks in typical "notch stress" test structures. Fine structures of the test mask, such as grooves 5 μm in width, microgearwheels, microspirals, ridges with a width of 25 μm, and columns with a diameter of 25 μm are free from singular and statistical defects.

Comparative Example 1

A test specimen made from PMMA was irradiated for 13.5 minutes under the corresponding conditions and structured using the developer (GG developer) optimized for PMMA. The structure depth was only 80 μm. Stress cracks occur in the notch stress test structures, at the microgearwheel rims and in the microspirals. Other microstructures of the test mask, such as grooves with a width of 5 μm, ridges with a width of 25 μm, and columns with a diameter of 25 μm, are free from singular and statistical defects.

EXAMPLE 2

An L-polylactide having an inherent viscosity of 2.9 dl/g (for example the commercial product Resomer® LR 909 from Boehringer KG) as a test specimen measuring 30×10×2 mm was irradiated imagewise for 13.5 minutes on a synchrotron with an electron energy of 2.3 GeV at a mean ring current of 25 mA and a scanner traverse of 10 mm through an X-ray mask containing test structures. The structuring took place during subsequent development with a 1% strength solution of sodium hydroxide in water/isopropanol 1:1 at 25° C. for 30 minutes. The structure depth was 380 μm. The structured L-polylactide is completely free from stress cracks in typical notch stress test structures. Microstructures of the test mask, such as grooves with a width of 5 μm, gearwheels, spirals, ridges with a width of 25 μm, and columns with a diameter of 25 μm are free from singular and statistical defects.

Comparative Example 2

A test specimen made from PMMA was irradiated for 13.5 minutes under the corresponding conditions. The structure depth was only 80 μm (development with GG developer). Stress cracks occur in the notch stress test structures, at the microgearwheel rims and in the microspirals. Other microstructures of the test mask, such as grooves with a width of 5 μm, ridges with a width of 25 μm, and columns with a diameter of 25 μm, are free from singular and statistical defects.

EXAMPLE 3

An L-polylactide as used in Example 1 was irradiated imagewise for 22.5 minutes on a synchrotron with an electron energy of 2.3 GeV at a mean ring current of 25 mA and a scanner traverse of 10 mm through an X-ray mask containing test structures. The structuring took place during subsequent development with a 1% strength solution of sodium hydroxide in water/isopropanol 1:1 at 25° C. for 30 minutes. The structure depth was 475 μm. The structured L-polylactide is completely free from stress cracks in typical notch stress test structures. Fine structures of the test mask, such as grooves with a width of 10 μm, microgearwheels, microspirals, ridges with a width of 25 μm, and columns with a diameter of 25 μm are free from singular and statistical defects.

Comparative Example 3

A test specimen made from PMMA was irradiated for 22.5 minutes under the corresponding conditions. The structure depth was only 150 μm (development with GG developer). Stress cracks occur in the notch stress test structures, at the miorogearwheel rims and in the microspirals. Other microstructures of the test mask, such as grooves with a width of 10 μm, ridges with a width of 25 μm, and columns with a diameter of 25 μm, are free from singular and statistical defects.

EXAMPLE 4

An L-polylactide as used in Example 2 was irradiated imagewise for 22.5 minutes on a synchrotron with an electron energy of 2.3 GeV at a mean ring current of 25 mA and a scanner traverse of 10 mm through an X-ray mask containing test structures. The structuring took place during subsequent development with a 1% strength solution of sodium hydroxide in water/isopropanol 1:1 at 25° C. for 30 minutes. The structure depth was 500 μm. The structured L-polylactide is completely free from stress cracks in typical notch stress test structures. Microstructures of the test mask, such as grooves with a width of 10 μm, microgearwheels, microspirals, ridges with a width of 25 μm, and columns with a diameter of 25 μm are free from singular and statistical defects.

Comparative Example 4

A test specimen made from PMMA was irradiated for 22.5 minutes under the corresponding conditions. The structure depth was only 150 μm (development with GG developer). Stress cracks occur in the notch stress test structures, at the microgearwheel rims and in the microspirals. Other microstructures of the test mask, such as grooves with a width of 10 μm, ridges with a width of 25 μm, and columns with a diameter of 25 μm, are free from singular and statistical defects.

EXAMPLE 5

An L-polylactide having an inherent viscosity of from 7 to 9 dl/g (granules, for example the commercial product Resomer® L 214 from Boehringer KG) was applied to a copper substrate plate having a surface roughness of 200 nm by compression molding (250 kg/cm$^2$) at 200° C. for 2 minutes in a 30×80 mm metal frame. The coating thickness was 120 μm.

The sample was irradiated imagewise for 13.5 minutes on a synchrotron with an electron energy of 2.3 GeV at a mean ring current of 25 mA and a scanner traverse of 10 mm through an X-ray mask containing test structures. The structuring took place during subsequent development with a 1% strength solution of sodium hydroxide in water/isopropanol 1:1 at 25° C. for 30 minutes. The structure depth was 120 μm, ie. the electroconductive substrate plate was uncovered. The structured L-polylactide is completely free from stress cracks in typical notch stress test structures. Fine structures of the test mask, such as grooves with a width of 5 μm, microgearwheels, microspirals, ridges with a width of 40 μm, and columns with a diameter of 25 μm are free from singular and statistical defects.

Comparative Example 5

PMMA cannot be correspondingly structured on a copper plate since the GG developer complexes and partly dissolves the copper.

EXAMPLE 6

An L-polylactide having an inherent viscosity of from 7 to 9 dl/g (granules, for example the commercial product Resomer® L 214 from Boehringer KG) was applied to a copper substrate plate having an approximately 3 μm titanium coating which was oxidized on the surface by compression molding (250 kg/cm$^2$) at 200° C. for 2 minutes in a 30×80 mm metal frame. The surface roughness of the copper plate was about 200 nm. The resist coating thickness was 350 μm.

The sample was irradiated imagewise for 37.8 minutes on a synchrotron with an electron energy of 2.3 GeV at a mean ring current of 25 mA and a scanner traverse of 28 mm through an X-ray mask containing test structures. The structuring took place during subsequent development with a 1% strength solution of sodium hydroxide in water/isopropanol 1:1 at 25° C. for 30 minutes. The structure depth was 350 μm, ie. the electro-conductive substrate plate was uncovered. The structured L-polylactide is completely free from stress cracks in typical notch stress test structures. Fine structures of the test mask, such as grooves with a width of 5 μm, microgearwheels, microspirals, ridges with a width of 25 μm, and columns with a diameter of 40 μm are free from singular and statistical defects. The structure laminate can be used for electrodeposition of metals by the LIGA process.

Comparative Example 6

A laminate made from PMMA (350 μm) and the substrate described in Example 6 was irradiated for 37.8 minutes under the corresponding conditions. The structure depth was only 90 μm (development with GG developer). The electroconductive substrate plate was not uncovered. The structured laminate can therefore not be used for electrodeposition of metals by the LIGA process.

We claim:

1. A process for producing microstructure elements having structure depths of from several μm to the mm region which comprises: applying an aliphatic polyester onto a substrate, imagewise irradiating the aliphatic polyester with X-rays, and thereafter contacting the irradiated polyester with a developer.

2. A process as defined in claim 1, wherein the X-ray radiation is synchrotron radiation.

3. A process as defined in claim 2, wherein microstructure elements having structure depths of from 10 μm to 2000 μm and lateral dimensions of less than 10 μm are produced.

4. A process as defined in claim 3, wherein the developer employed is an aqueous or alcoholic sodium hydroxide solution or an amine-containing solution.

5. A process as defined in claim 1, wherein the aliphatic polyester is applied to a substrate by injection molding, extrusion, casting or compression molding prior to the step of imagewise irradiating.

6. A process as defined in claim 1, wherein microstructure elements having structure depths of from 3 μm to 2000 μm are produced.

7. A process for producing microstructure elements having structure depths of from several μm to the mm region which comprises: applying an aliphatic polyester onto a substrate, imagewise irradiating the aliphatic polyester with X-rays, said polyester being selected from the group consisting of polyglycolide, polyactide and glycolide/lactide copolymers, and thereafter contacting the irradiated polyester with a developer.

8. A process as defined in claim 7, wherein microstructure elements having structure depths of from 10 μm to 200 μm and lateral dimensions of less than 10 μm are produced, wherein the X-ray radiation is synchrotron radiation.

* * * * *